United States Patent [19]
Saitoo et al.

[11] Patent Number: 4,862,321
[45] Date of Patent: Aug. 29, 1989

[54] COOLING SYSTEM FOR HEATING BODY

[75] Inventors: Shuuji Saitoo; Yoshikatu Tokunaga, both of Katsuta, Japan

[73] Assignee: Hitachi, Ltd., Tokyo, Japan

[21] Appl. No.: 250,159

[22] Filed: Sep. 28, 1988

[30] Foreign Application Priority Data

Sep. 30, 1987 [JP] Japan .................................. 62-243818

[51] Int. Cl.[4] .............................................. H05K 7/20
[52] U.S. Cl. ........................................ 361/385; 62/418; 357/82
[58] Field of Search .................... 62/119, 514 R, 418; 361/382, 385–389; 357/82; 165/104.33, 80.4; 174/15.2

[56] References Cited

U.S. PATENT DOCUMENTS 4,330,033  5/1982  Okada .................................. 361/385
4,694,323  9/1987  Itahana ................................ 361/382

FOREIGN PATENT DOCUMENTS 53-157459  12/1978  Japan .

Primary Examiner—Gerald P. Tolin
Attorney, Agent, or Firm—Antonelli, Terry & Wands

[57] ABSTRACT

The present invention relates to a cooling system for a heating body to cool the heating body by ebullition and evaporation of a liquid refrigerant, wherein a liquid return pipe passing through a connecting pipe which connects an evaporation vessel and a condenser is branched off from said connecting pipe on the evaporation vessel side to open at its one end in the bottom of said evaporation vessel, in order to smooth the return of the refrigerant evaporated and liquified again into the evaporation vessel and to maintain a stable cooling effect.

7 Claims, 2 Drawing Sheets

COOLING SYSTEM FOR HEATING BODY

BACKGROUND OF THE INVENTION

This invention relates to a cooling system for a heating body, and more particularly, to a cooling system for a heating body which cools the heating body by ebullition and evaporation of liquid refrigerant.

Generally, a cooling system for a heating body, as is described in Japanese Utility Model Laid-Open Publication No. 53-157459, comprises a pipe for leading to a condenser refrigerant gas obtained by vaporing liquid refrigerant after ebullition and evaporation of itself within an evaporation vessel, and a liquid return pipe to return the refrigerant liquified in the condenser to the bottom of the evaporation vessel.

It is necessary to provide these two kinds of pipes so as to prevent the degradation of cooling effect due to mixing of the refrigerant gas and the liquified refrigerant.

The above structure including the heating body mounted within the evaporation vessel had such problem that the lacking in consideration with regard to the cooling system for a heating body which contacts with the surface of the evaporation vessel and is provided with a thermal conductor therein causes ebullition of the liquid refrigerant in the liquid return pipe and the exhaustion of liquid in the evaporation vessel, which results in a thermal runaway To be explained concretely, because the heat conduction body installed in the evaporation vessel is formed with a plurality of heat radiation holes in the upward and downward direction to ensure effective radiation and the end of the liquid return pipe is secured by utilizing these holes, the temperature of the liquid return pipe rises according to the temperature rise of the thermal conductor over a certain degree, causing the liquified returned refrigerant to boil within the liquid return pipe. As a result, when the liquid refrigerant keeps on evaporating while the liquified refrigerant is prevented from returning into the evaporation vessel by the liquid return pipe, the liquid refrigerant within the evaporation vessel is dried up, and loses its cooling power, which results in a thermal runaway.

SUMMARY OF THE INVENTION

One object of the present invention is to provide a cooling system for a heating body which smooths the return of the liquified refrigerant to the evaporation vessel and maintains a stable cooling effect.

In order to achieve the above-mentioned object, in the present invention, the liquid return pipe to return the liquified refrigerant to the evaporation vessel is branched from the connecting pipe in the vicinity of the connecting portion of the evaporation vessel and the connecting pipe and is provided with an opening within the bottom of the evaporation vessel.

According to the structure, even when the temperature of the cooling body within the evaporation vessel rises, the liquid return pipe, can return the liquified refrigerant to the bottom of the evaporation vessel without being affected by the temperature rise of the cooling body, thus preventing liquid exhaustion therein.

DETAILED DESCRIPTION OF THE PREFERRED EMBODIMENT

Figure 1:
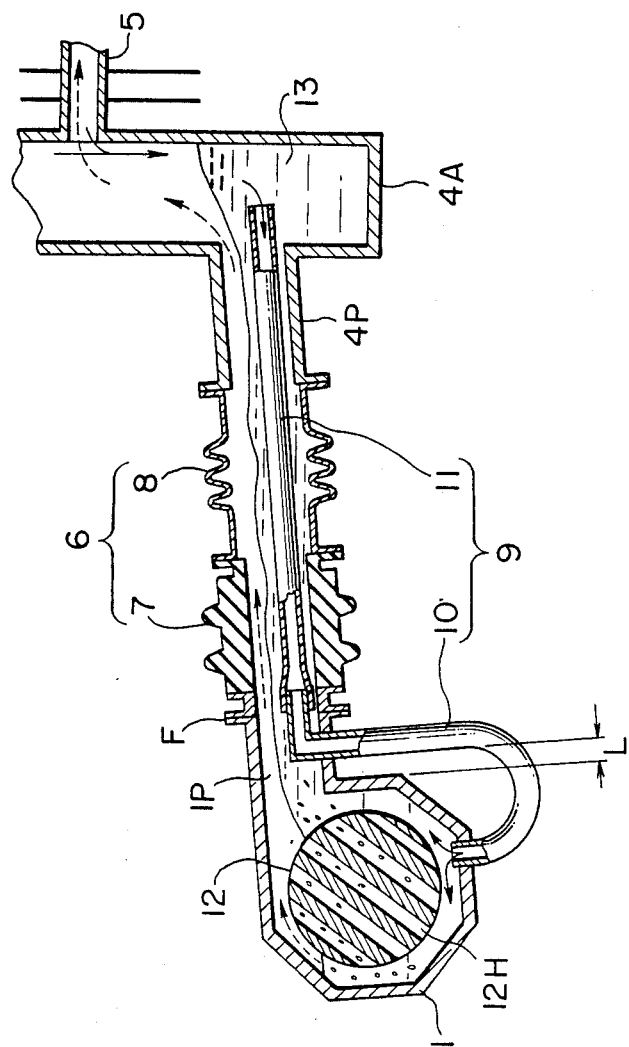
FIG. 1 is an enlarged cross-sectional view taken along the line I—I in FIG. 2 which shows one preferred embodiment of a cooling system for a heating body according to the present invention
Figure 2:
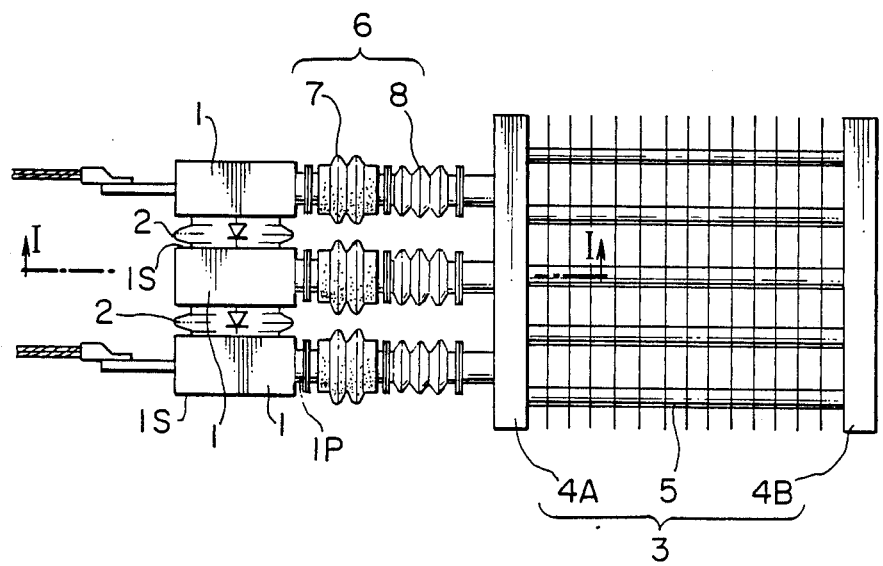
FIG. 2 is a top plan view, showing one preferred embodiment of the cooling system for a heating body according to the present invention.
Figure 3:
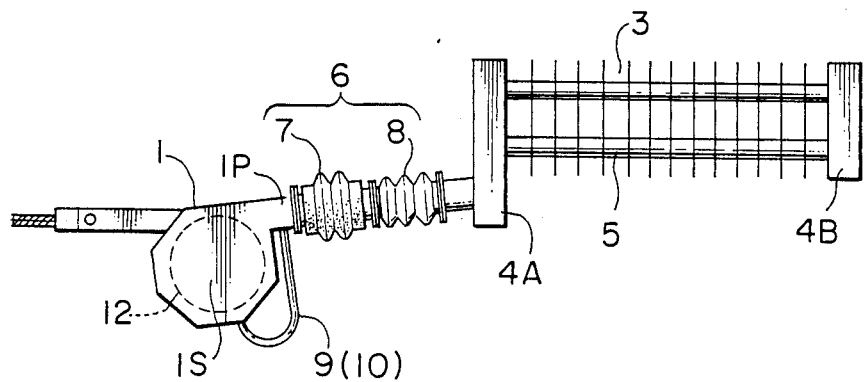
FIG. 3 is a side view of the same in FIG. 2.

One preferred embodiment of the present invention will be described hereinafter with reference to FIGS. 1-3. Evaporation vessels 1 include on both sides of their surface contact portions 1S which contact with flat type semi-conductor elements 2, and are also provided on their upper sides with connecting pipe portions 1P. The evaporation vessels 1 are respectively disposed between a plurality of semi-conductor elements 2 as well as on the utmost end sides to be crimpedly secured by holders (not shown). In the lateral direction of these evaporation vessels 1 is located a condenser 3 which comprises a pair of the first header 4A and the second header 4B and a number of finned condenser pipes 5 interposed therebetween. The connecting pipe portions 4P which are located on the lower part of the first header 4A of the condenser 3 are joined to the connecting pipe portions 1P of the evaporation vessels 1 through connecting pipes 6, thereby ensuring the airtightness between the evaporation vessels 1 and the condenser 3. The connecting pipes 6 are connected with a gentle slope in which the condenser 3 is higher than the evaporation vessels, which pipes are comprised of insulater pipes 7 on the side of the evaporation vessels 1 and bellows 8 on the side of the condenser 3. And, liquid return pipes 9 conforming liquid return passages over their overall lengths are provided within the connecting pipes 6. The liquid return pipes 9 are disposed to be located within the cross-sectional lower half portion of the connecting pipes 6, and their one ends overpassing the connecting pipes 6 branch off from the connecting pipe portions 1P of the evaporation vessels 1 outwardly to enter the evaporation vessels 1 from the bottoms thereof and open there. And the other ends of the liquid return pipes 9 are opened within the first header 4A. Further, these liquid return pipes 9 are so arranged as to be connected in the vicinity of the connecting portions between the connecting pipes 6 and the connecting pipe portions 1P. The portions which come out of the connecting pipe portions 1P of the evaporation vessels 1 to open their ends in the bottoms thereof are made of metal tubes 10, such as brass e.g. The remaining portions are manufactured with flexible insulating pipes 11, made of ethylene tetrafluoride e.g. Naturally, the connecting pipe portions 1P and the bottom portions of the evaporation vessels 1, through which the metal tubes 10 extend, are tightly sealed by welding or brazing.

In addition, thermal conductors 12 in contact with the inner peripheries of the contact portions 1S are mounted within said evaporation vessels 1. These thermal conductors 12 are provided with a great number of heat radiation holes 12H penetrating therethrough substantially lengthwise in order to improve efficiency of heat radiation by enlarging a heat discharging area.

A liquid refrigerant is charged into the cooling system for heating bodies so arranged as explained above, in such a manner that the upper sides of the liquid return pipes 9 in the connecting pipes 6 are lower than the surface of the liquid refrigerant.

In the afore-mentioned cooling system for heating bodies when heating values of the semi-conductor elements 2 are small, evaporation amount of the refrigerant within the evaporation vessels 1 is small. Accordingly, the refrigerant liquified within the condenser 3 returns into the evaporation vessels 1 through the connecting pipes 6 and the liquid return pipes 9.

When the heating values of the semi-conductor elements 2 are increased, the evaporation amount of the refrigerant is also increased, thus causing higher occupancy of refrigerant gas within the connecting pipes 6. As a result, the surface of the liquid refrigerant goes lower than the upper sides of the liquid return pipes 9 and most of the liquified refrigerant flows back into the evaporation vessels 1 through the liquid return pipes 9. In that case, because the metal tubes 10 are communicated with the insides of the bottoms of the evaporation vessels 1 passing the outsides of the evaporation vessels 1 out of the thermal conductors 12, they are not thermally influenced by the heat conductors 12. Therefore, the stability of cooling effect is maintained by thus preventing ebullition and evaporation of the refrigerant within the liquid return pipes 9 due to over-heating of the liquid return pipes 9 and also preventing liquid exhaustion within the evaporation vessels 1 caused by the halt of the return of the refrigerant.

And, in order to minimize influence from the thermal conductors 12 whose temperatures rise and the evaporation vessels 1 upon the metal tubes 10, a space L can be provided between the metal tubes 10 and the evaporation vessels 1.

Moreover, since the metal tubes 10 and insulator pipes 11, which constitute the liquid return pipes 9, are connected in the vicinity of the connecting portions of the connecting pipe portions 1P and the connecting pipes 6, the metal tubes 10 and the evaporation vessels 1 can be united prior to assembling the cooling system for heating bodies.

Further, the flexibility of the insulator pipes 11 allows their easy bending in case of changing positions of the evaporation vessels 1 and the condenser 3 with the bellows 8 interposed therebetween, thus in turn softens the accumulated power applied to the airtight joint portions of the metal tubes 10 and the connecting pipe portions 1P.

Besides, the metal tubes 10 are opened at their ends upwardly from the bottoms of the evaporation vessels 1, however, the opened directions are not restricted particularly.

Furthermore, the metal tubes 10 being outside of the evaporation vessels 1 and the heat radiation holes 12H of the thermal conductors 12 having no choking, the efficiency of heat exchange and the cooling performance of the thermal conductors 12 can be improved.

Incidentally, according to the afore-mentioned embodiment, the condenser 3 is disposed lateral to the evaporation vessels 1, but, it is also disposed above the evaporation vessels 1. Also the heating bodies are not limited to a flat type of the semi-conductor elements 2.

According to the present invention as has been described, it is possible to obtain a cooling system for heating bodies which prevents liquid exhaustion in its evaporation vessels and ensures a stable cooling effect.

We claim:

1. A cooling system for a heating body which comprises an evaporation vessel having a thermal conductor therein and being filled with liquid refrigerant, a condenser, a connecting pipe to connect said evaporation vessel and said condenser, and a liquid return pipe which passes through the connecting pipe and opens in said evaporation vessel at its one end as well as in said condenser at its other end, and which cools the heating body by means of said liquid refrigerant by contacting said heating body with the surface of said evaporation vessel, wherein one end of said liquid return pipe on said evaporation vessel side is branched off from said connecting pipe in the vicinity of the connecting portion of said evaporation vessel and said connecting pipe to open in the bottom of said evaporation vessel.

2. A cooling system for a heating body according to claim 1, wherein said evaporation vessel is provided with a connecting pipe portion attached to said connecting pipe and said liquid return pipe is branched off at said connecting pipe portion.

3. A cooling system for a heating body according to claim 2, wherein said liquid return pipe is made up by connecting a pipe leading to the bottom of said evaporation vessel and a pipe leading to said condenser, which pipes are connected in the vicinity of the connecting portion between the connecting pipe portion of said evaporation vessel and said connecting pipe.

4. A cooling system for a heating body according to claim 3, wherein said pipe leading to said condenser is flexible.

5. A cooling system for a heating body according to claim 1, wherein said heating body is a semi-conductor element, said evaporation vessel includes a connecting pipe portion to be connected to said connecting pipe, said connecting pipe includes an insulator pipe disposed on said evaporation vessel side and a bellows disposed on said condenser side, and said liquid return pipe comprises a metal tube and a flexible insulator pipe connected in the vicinity of the connecting portion between the connecting pipe portion of said evaporation vessel and said connecting pipe, which metal tube is branched off at the connecting pipe portion.

6. A cooling system for a heating body according to claim 5, wherein said condenser is located laterally to said evaporation vessel and said connecting pipe is slanted upwardly toward said condenser.

7. A cooling system for a heating body according to claim 5, wherein a plurality of said evaporation vessels are provided and at least said semi-conductor element is press-fitted onto the surface of one said evaporation vessels.

* * * * *